US007275193B1

(12) United States Patent
Verma

(10) Patent No.: US 7,275,193 B1
(45) Date of Patent: Sep. 25, 2007

(54) METHOD AND APPARATUS FOR MEASURING CROSSTALK ON A PROGRAMMABLE LOGIC DEVICE

(75) Inventor: Himanshu J. Verma, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 259 days.

(21) Appl. No.: 11/201,688

(22) Filed: Aug. 11, 2005

(51) Int. Cl.
*G01R 31/28* (2006.01)
*G06F 9/45* (2006.01)
(52) U.S. Cl. .......................... 714/725; 716/6
(58) Field of Classification Search ................ None
See application file for complete search history.

(56) References Cited

U.S. PATENT DOCUMENTS 7,210,115 B1 * 4/2007 Rahim et al. ................ 716/16

FOREIGN PATENT DOCUMENTS

JP 02084817 A * 3/1990

JP 10321794 A * 12/1998

OTHER PUBLICATIONS

On-line Testing of Transient and Crosstalk Faults Affecting Interconnections of FPGA- Implementedd Systems by Metra et al. ITC International Test Conference 2001 p. 939-947.*
U.S. Appl. No. 11/201,462, filed Aug. 11, 2005, Verma et al.
U.S. Appl. No. 11/061,697, filed Feb. 18, 2005, Verma et al.
U.S. Appl. No. 10/255,502, filed Sep. 26, 2003, Lesea.
U.S. Appl. No. 10/402,837, filed Mar. 27, 2003, Lesea.

* cited by examiner

*Primary Examiner*—Cynthia Britt
(74) *Attorney, Agent, or Firm*—LeRoy D. Maunu

(57) ABSTRACT

A method and apparatus for the utilization of on-chip, programmable resources to implement a signal distortion characterization circuit. Programmable logic resources, such as programmable delay lines and phase shifting circuits, are utilized to obtain estimates of, for example, capacitive coupling of signal energy between various signal and clock routes within a programmable logic device (PLD). Progressively delayed/advanced samples are taken of a test signal transmitted through a victim net to form baseline test data. Samples of the test signal are then repeated in the presence of test signals transmitted through aggressor net(s) and compared to the baseline results to measure crosstalk distortion caused by capacitively coupled energy from the aggressor nets onto the victim net.

20 Claims, 6 Drawing Sheets

METHOD AND APPARATUS FOR MEASURING CROSSTALK ON A PROGRAMMABLE LOGIC DEVICE

FIELD OF THE INVENTION

The present invention generally relates to programmable logic devices (PLDs), and more particularly to PLDs configured to perform self-diagnostic testing.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is determined by the data bits used to configure the reconfigurable resources of the device. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Demand for increased operational frequency and increased PLD density has contributed to shrinking geometries of the configurable resources used within the PLDs. Accordingly, more compact routing and interconnect layouts are used to interconnect the configurable resources to achieve a particular design goal. As such, the opportunity for capacitive coupling between the components and their respective interconnections may increase.

The ability to measure such capacitive coupling is often required to ensure proper functionality and speed performance. Current techniques utilize circuit simulations to predict the capacitive coupling between adjacent nets, or signal routes, of a particular design. Circuit simulations, however, employ circuit models of PLD resources to predict their performance under simulated operating conditions. Such circuit models may inject a certain amount of error into the simulated test results, due to the inability of the circuit models to capture actual circuit behavior as they are implemented on a silicon based electronic device, such as a PLD.

SUMMARY

To overcome limitations in the prior art, and to overcome other limitations that will become apparent upon reading and understanding the present specification, various embodiments of the present invention disclose an apparatus and method for deterministically ascertaining capacitive coupling characteristics, such as crosstalk distortion, within programmable logic devices (PLDs).

In accordance with one embodiment of the invention, a method of measuring signal distortion within an integrated circuit (IC) comprises transmitting a first test signal through a first path within the IC absent other test signals in proximity to the first path, sampling the first test signal received from the first path at progressively delayed sampling instances with respect to the first test signal to generate a first set of test data, transmitting a second test signal through a second path within the IC in proximity to the first path while the first test signal is being transmitted, and sampling the first test signal received from the first path at progressively delayed sampling instances with respect to the first test signal while the second test signal is being transmitted to generate a second set of test data. The differences between the first and second sets of test data indicate a measure of signal distortion.

In accordance with another embodiment of the invention, a signal distortion measurement circuit comprises a signal generator that is adapted to generate a first test signal during a first test period and is adapted to generate first and second test signals during a second test period, a first test path that is coupled to receive the first test signal from the signal generator, and a second test path in proximity to the first test path that is coupled to receive the second test signal from the signal generator. The signal distortion measurement circuit further comprises a measurement circuit that is coupled to the first and second test paths and is adapted to sample the first test signal at progressively delayed sampling instances during the first and second test periods. The measurement circuit is further adapted to generate respective first and second sets of test data, where a level of signal distortion is indicated by differences between the first and second data sets.

In accordance with another embodiment of the invention, a method of configuring a programmable logic device (PLD) to measure crosstalk distortion comprises defining a plurality of test paths within the PLD, configuring logic resources within the PLD to implement a test circuit coupled to the plurality of test paths, and activating the test circuit to perform a crosstalk measurement. Activating the test circuit includes, transmitting a first test signal through a first test path in the absence of other test signals, sampling the first test signal at the output of the first test path at progressively delayed sampling instances relative to the first test signal during a first test period, transmitting a second test signal through a second test path in the presence of the first test signal, and sampling the first test signal at the output of the first test path at progressively delayed sampling instances relative to the first test signal while transmitting the second test signal during a second test period. The samples taken during the first and second test periods are compared to determine the measure of crosstalk distortion.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
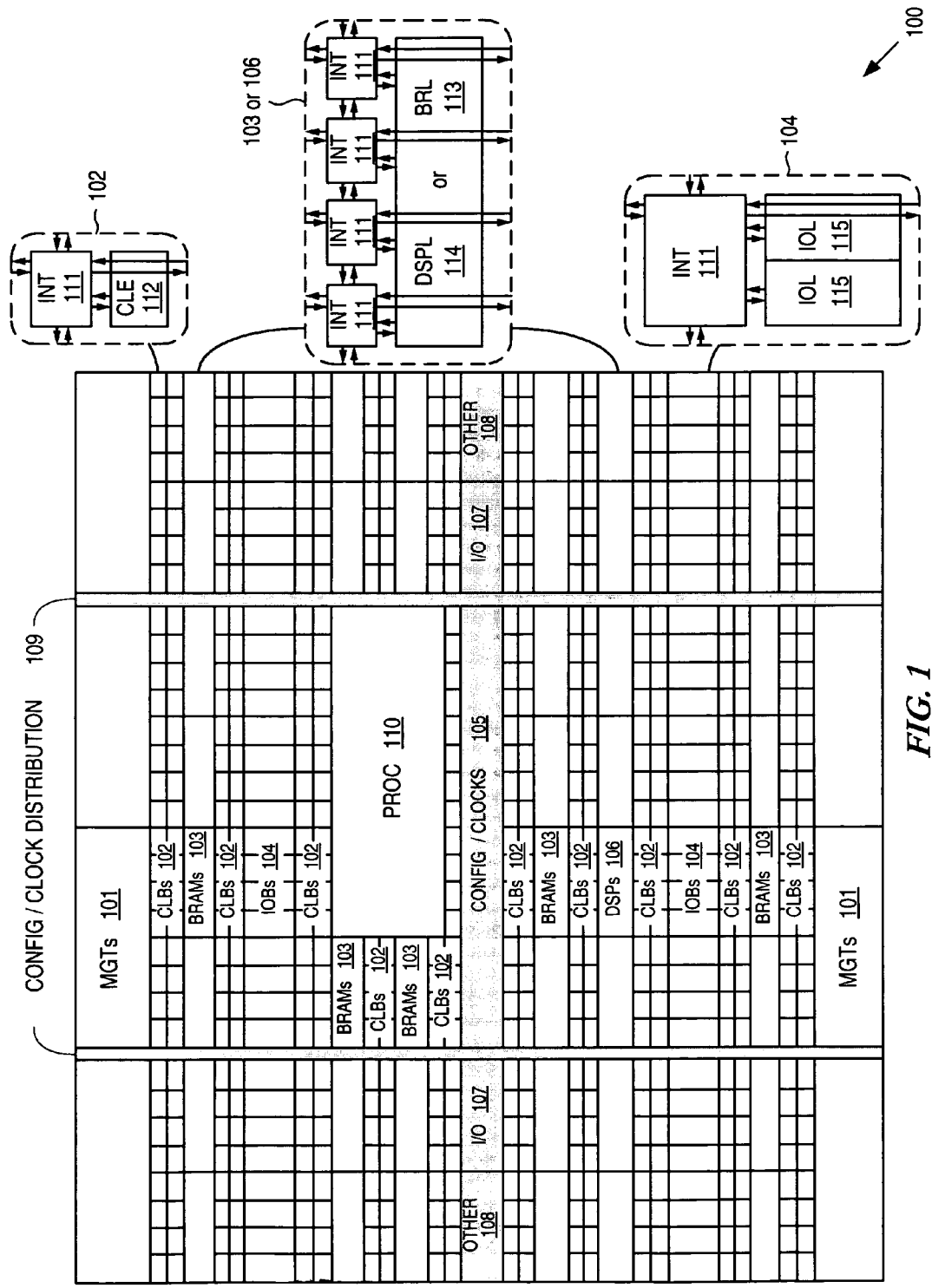
FIG. 1 illustrates an exemplary Field Programmable Gate Array (FPGA) architecture.

Generally, various embodiments of the present invention are applied to the field of integrated circuits (ICs) of which PLDs are a subset. In particular, the various embodiments of the present invention provide a method and apparatus for the utilization of on-chip, programmable resources to implement a signal distortion characterization circuit. Programmable logic resources, such as programmable delay lines and phase shifting circuits, are utilized to obtain estimates of, for example, capacitive coupling of signal energy from signal routes, i.e., nets, that are operating in the vicinity of a path under test (PUT), i.e., a victim net.

In one embodiment, a test signal, i.e., the victim signal, is introduced at the input of the victim net, while one or more test signals, i.e., aggressor signals, are introduced at the input(s) of one or more aggressor nets. The aggressor net(s) are programmably arranged in proximity to the victim net, such that capacitively coupled energy of the aggressor signals propagating through the aggressor nets may appear on the victim signal propagating through the victim net. At an output of the victim net, a sampling circuit is configured to receive the victim signal, in order to sample the test signal at programmably delayed/advanced sampling instances. The sampling instances are programmably delayed/advanced with respect to a phase of the test signal, such that an entire period, i.e., 360 degrees, of the test signal is traversed.

Once the test period is complete, a set of sampled data may then be analyzed to reconstruct the victim signal samples taken during the test period. By reconstructing the victim signal samples, a representation of the effects on the victim signal caused by the coupling of aggressor signal energy onto the victim signal may be generated. By comparison of the reconstructed victim signal with the aggressor signal(s), a depiction of the capacitive coupling effects may be determined at various phases of the aggressor signal(s) with respect to corresponding phases of the victim signal.

Due to the programmability of the PLD, a plurality of victim nets and aggressor nets may be defined for test. For example, global clock/data resources are often employed within PLDs to provide a dedicated interconnect network that is designed to be accessible by the clock/data inputs of the various reconfigurable resources of the PLD. Thus, during configuration of the PLD, for example, a plurality of sampling circuits may be placed at one end of a clock/data interconnect network, while a clock generation resource is placed at the other end of the clock/data interconnect network. One of the clock/data nets may be designated as the victim net, while one or more adjacent clock/data nets may be designated as the aggressor net(s).

In an alternative embodiment, the clock generation resource may inject a victim signal into the victim net, while the corresponding sampling circuit at the output of the victim net samples the victim signal in the absence of aggressor signals. Next, the clock generation resource may inject one or more aggressor signals into the aggressor nets that may be arranged in proximity to the victim net, while the victim net sampling circuit samples the victim signal at the other end of the victim net. A reconstructed victim signal emerging from the victim net in the presence of the aggressor signals may be generated along with a reconstructed victim signal emerging from the victim net in the absence of the aggressor signals. A comparison of the reconstructed victim signals with and without the aggressor signals may then be performed to determine any victim signal disparities that may have been caused by the coupling of aggressor signal energy onto the victim signal.

As noted above, advanced ICs, such as FPGAs, can include several different types of programmable logic blocks in the array. For example, FIG. 1 illustrates an IC that exemplifies FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104.

For example, a CLB 102 may include a Configurable Logic Element CLE 112 that may be programmed to implement user logic plus a single programmable interconnect element INT 111. A BRAM 103 can include a BRAM logic element (BRL 113) in addition to one or more programmable interconnect elements. In accordance with various embodiments of the present invention, therefore, interconnect elements INT 111 may be used to route a victim signal and corresponding aggressor signals through almost any path of FPGA 100. Through the use of associated sampling circuitry, therefore, virtually any path within FPGA 100 may be analyzed for crosstalk distortion, subject to various restrictions of placement and routing that may exist with the design tool/FPGA target being utilized.

Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111.

As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Various embodiments of the present invention may then be employed, for example, to identify and quantify any crosstalk distortion that may be caused by adjacent signals operating along the horizontal or columnar areas as illustrated, for example, by shaded areas 105 and 109. A plethora of other nets, however, placed at virtually any point within the FPGA may also be employed as victim/aggressor nets in accordance with various embodiments of the present invention.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs.

Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

Figure 2:
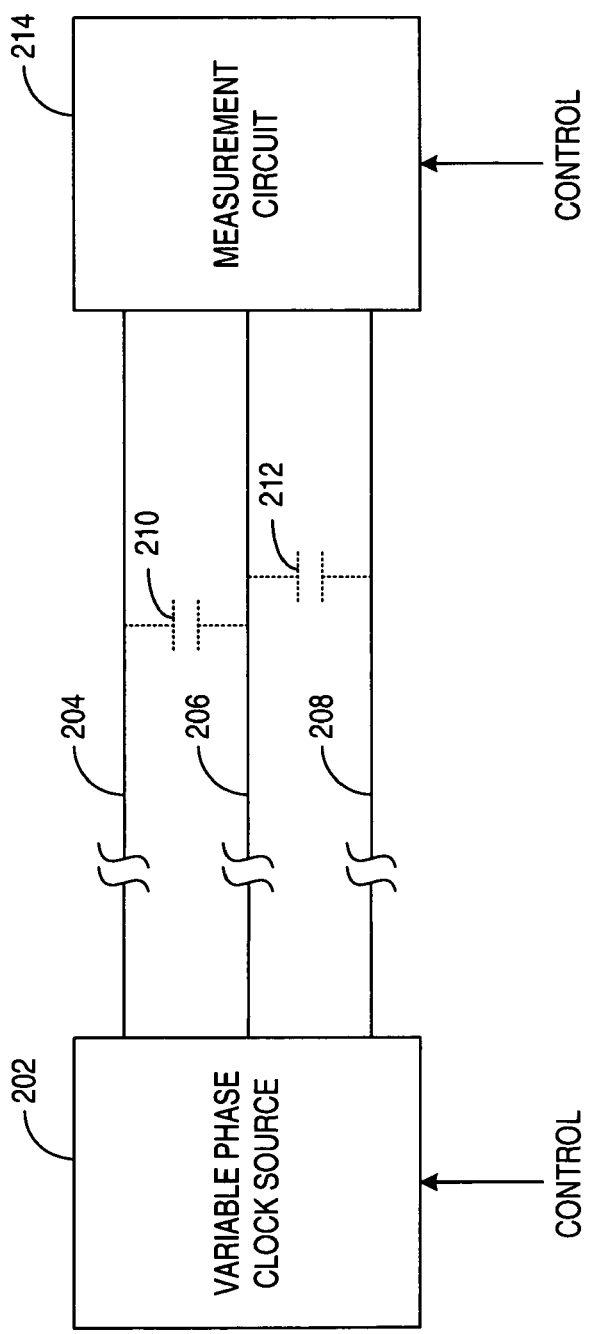
FIG. 2 illustrates an exemplary depiction of capacitive coupling between aggressor and victim signal interconnects.

Turning to FIG. 2, an exemplary depiction of capacitive coupling, e.g., 210 and 212, between victim net, e.g., 206, and aggressor nets, e.g., 204 and 208, is illustrated. Nets 204-208 may represent virtually any signal route/interconnect that may be configured within a PLD. Similarly, variable phase clock source 202 represents one of many resources available within, for example, some Xilinx Virtex® FPGAs, which allow the production of clock signals exhibiting fine-grain phase shifts with respect to an input clock signal. Measurement circuit 214 may also be configured within the PLD to sample and analyze the victim and aggressor signals transmitted via nets 204-208.

As discussed above, net 206 may represent the victim net, which is paralleled by aggressor nets 204 and 208. Capacitance 210 and 212 represents any capacitive coupling that may exist between the nets. Generally, an amount of capacitive coupling generated between nets 204-208 is dependent upon various parameters, such as net length, net separation (which includes three dimensional separation for multi-layered integrated circuits), and the edge rate of the signal being propagated by the net. Other parameters, such as the relative geometry between the nets, may also affect the amount of coupling that may occur between them. That is to say, for example, that nets exhibiting parallel geometries, as illustrated in FIG. 2, may be more conducive to capacitive coupling as compared to nets that are perpendicular to each other.

Variable phase clock source 202 may act as a signal generator to transmit test signals through each of nets 204-208. Each test signal generated may exhibit a different phase as compared to the other test signals generated. As such, capacitive coupling between nets 204-208 may be characterized over a wide range of relative phase offsets to determine which, if any, particular phase offset results in crosstalk distortion. For example, test signals in phase synchronization with one another may induce less destructive crosstalk than test signals at other phase offsets, since magnitudes of the phase synchronous test signals transition at the same instances in time.

Measurement circuit 214 is configured to receive the test signals transmitted by variable phase clock source 202. In particular, measurement circuit 214 samples the test signal received from at least the victim net, e.g., 206, before and after the aggressor nets, e.g., 204 and 208, are energized at various phase offsets relative to the phase of the victim net's test signal. Thus, measurement circuit 214 effectively slices the transmitted test signal received from victim net 206 by sampling the received test signal at progressively delayed (advanced) instances in time until an entire cycle of the victim net's test signal has been traversed.

During a first phase of operation, clock source 202 may transmit a test signal through victim net 206 so that measurement circuit 214 may reconstruct a baseline test signal received from victim net 206 in the absence of any potentially interfering aggressor nets. During a second phase of operation, clock source 202 may activate aggressor test signals within aggressor nets 204 and/or 208, while also transmitting a test signal through victim net 206. Measurement circuit 214 again reconstructs the test signal received from victim net 206 and compares the reconstructed signal with the baseline results to determine any differences between the two test sequences. Any differences that are determined may then be characterized as being caused, for example, by crosstalk distortion.

Test signals in aggressor nets 204 and 208 may be phase adjusted relative to the phase of the test signal in victim net 206. By varying the phase offset of the aggressor test signals with respect to the victim test signal, a characterization of the magnitude of crosstalk distortion exerted over a wide range of phase offsets is possible.

Figure 3:
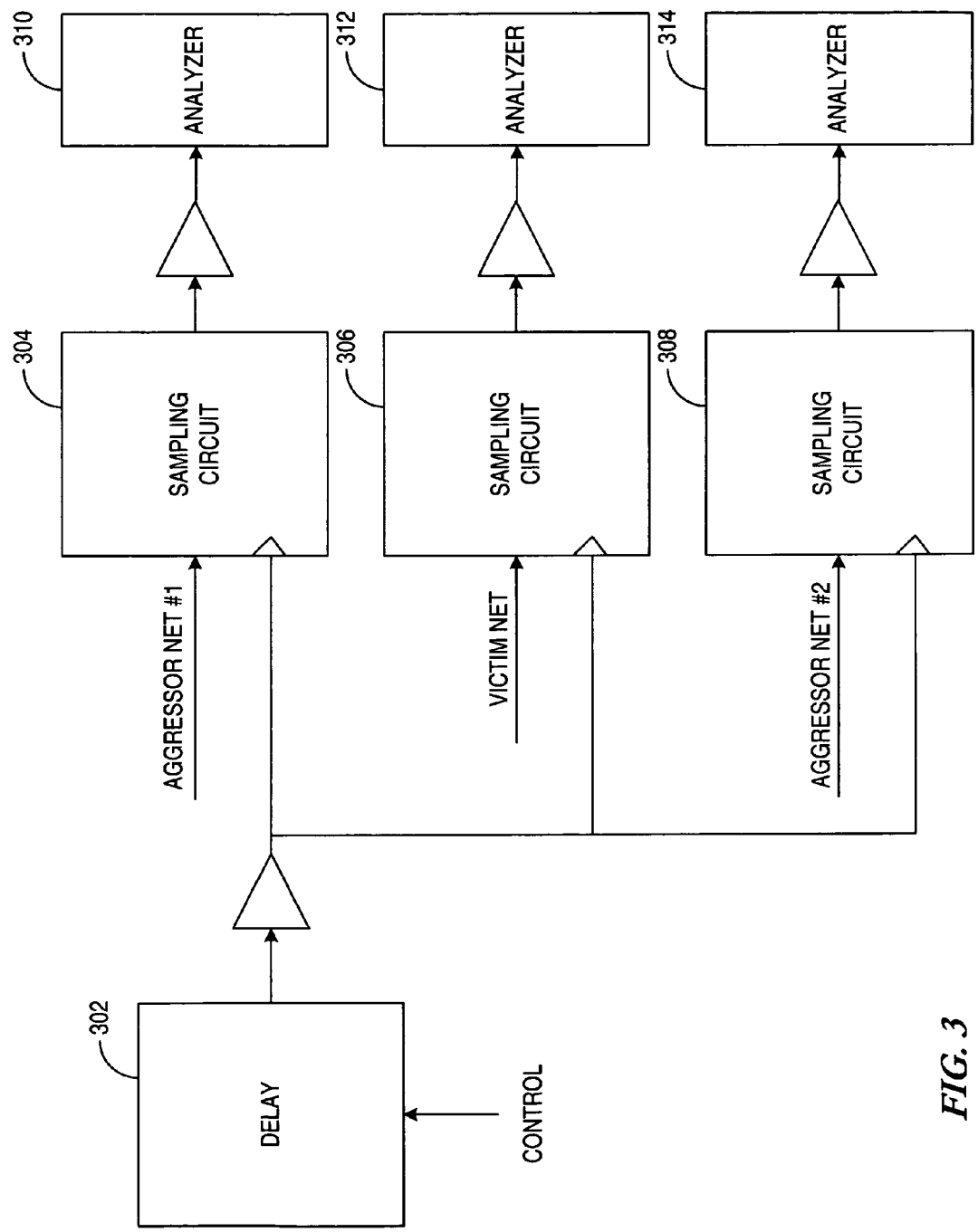
FIG. 3 illustrates an exemplary block diagram of a reconfigurable test circuit in accordance with one embodiment of the present invention.

Turning to FIG. 3, an exemplary block diagram of reconfigurable measurement circuit 214 of FIG. 2 in accordance with one embodiment of the present invention is illustrated. Delay circuit 302 may receive a sampling clock and may exert a programmably progressive amount of delay to the received sampling clock before transmitting a delayed sampling clock to sampling circuits 304-308. Delay circuit 302 may initially provide a delayed sampling clock that exhibits no delay with respect to the input sampling clock and may incrementally increase the delay offsets until a complete cycle, or a full 360 degree phase rotation, of the input sampling clock is traversed. Alternatively, delay circuit 302 may begin the test sequence with maximum delay and then decrement the amount of delay offset until a full 360 degree phase rotation is traversed.

Aggressor net #1 and aggressor net #2 correspond, for example, to nets 204 and 208 of FIG. 2, while victim net may correspond to net 206 of FIG. 2. Sampling circuit 306 is configured from a programmable resource within the PLD to receive a test signal from the victim net and to sample the test signal received at various instances as defined, for example, by rising edge transitions of the programmably delayed sampling clock received from delay circuit 302. Sampling circuits 304 and 308 are optional and may be similarly configured and operated.

Analyzer 312 may be used in a first phase of operation to determine a baseline performance of the victim net in the absence of the signals propagated through the aggressor net(s). Analyzer 312 may then be used to determine the perturbed performance induced in the victim net by the presence of signals propagated through the aggressor net(s). Analyzer 312 may also be used for any further statistical measurements that can be generated, such as cross-correlation data to suggest the effect of the victim net on the aggressor net(s). In such an instance, sampling circuits 304 and 308 may be used to reconstruct the test signals propagated through the aggressor net(s) in the presence and absence of the test signal propagated through the victim net.

In one embodiment of the present invention, variable phase clock source 202 and delay circuit 302 may be combined within one or more circuits. In particular, digital clock managers (DCMs) available in some Xilinx Virtex® FPGAs, allow the production of clock signals exhibiting fine-grain phase shifts with respect to an input clock signal. In particular, the phase of the clock signal generated by the DCM may be advanced or retarded with respect to the phase of the input clock signal to the DCM in increments equal to $\frac{1}{256}^{th}$ of a clock period. In such an instance, therefore, the phase of the output signal may be advanced or retarded by 1.4 degrees with respect to one cycle of the input clock signal.

In an alternative embodiment of the present invention, an IOB may be utilized to provide the delay function as illustrated by delay circuit 302. In some Xilinx Virtex® FPGAs, a programmable absolute delay element may be instantiated within an IOB. The delay element is a 64-tap, wrap-around delay element with a fixed tap resolution that is dependent upon a control clock. If the control clock frequency is 200 MHz, for example, then the control clock period is 5 nanoseconds (nS), which in turn provides a delay resolution of 5 nS/64, or 78.125 picoseconds (pS).

Sampling circuits 304-308 receive test signals from aggressor net #1, victim net, and aggressor net #2 at their respective data inputs. Additionally, sampling circuits 304-308 receive the programmably delayed clock signal from delay circuit 302 at their respective sample clock inputs. The aggressor and victim nets are generally configured as signal routing and interconnect, which may or may not contain combinatorial logic elements. As discussed above, the aggressor and victim nets may be configured and routed in close proximity to one another, so that the magnitude of crosstalk may be characterized.

In operation, sampling instances of sampling circuits 304-308 occur at, for example, rising edge transitions of the delayed sample clocks received from delay circuit 302 during a test period. The logic value of the test signals that are incident to the respective data inputs of sampling circuits 304-308 during each rising edge transition are then latched and provided to analyzer 312 for analysis.

In one embodiment, the period of each test signal received by sampling circuits 304-308 may be equivalent to the period of their respective sampling clocks. In such an instance, only a single sample is possible for each cycle of the test signals. Thus, if the test period extends for an amount of time equal to 64 cycles of the test signal, then a total of 64 samples will be collected. Alternately, if the test period extends for an amount of time equal to 256 cycles of the test signal, then a total of 256 samples will be collected. In general, therefore, the number of samples collected is equivalent to the number of test signal cycles that transpired during the test period, when the period of the test signals and the sampling clocks are the same.

In other embodiments, however, the sampling clock period is not equivalent to the period of each test signal and further may be greater than, or less than, the period of each test signal. In such instances, however, the relative periods of the test signals and the sampling clocks should be known in order to correctly analyze the test data as gathered by analyzer 312 into crosstalk distortion measurements. In any instance, the test signals and the sampling clocks should be phase coherent with one another, so that the delay increments exerted upon the sampling clocks may be accurately correlated with the associated phase offsets relative to the test signals.

Figure 4:
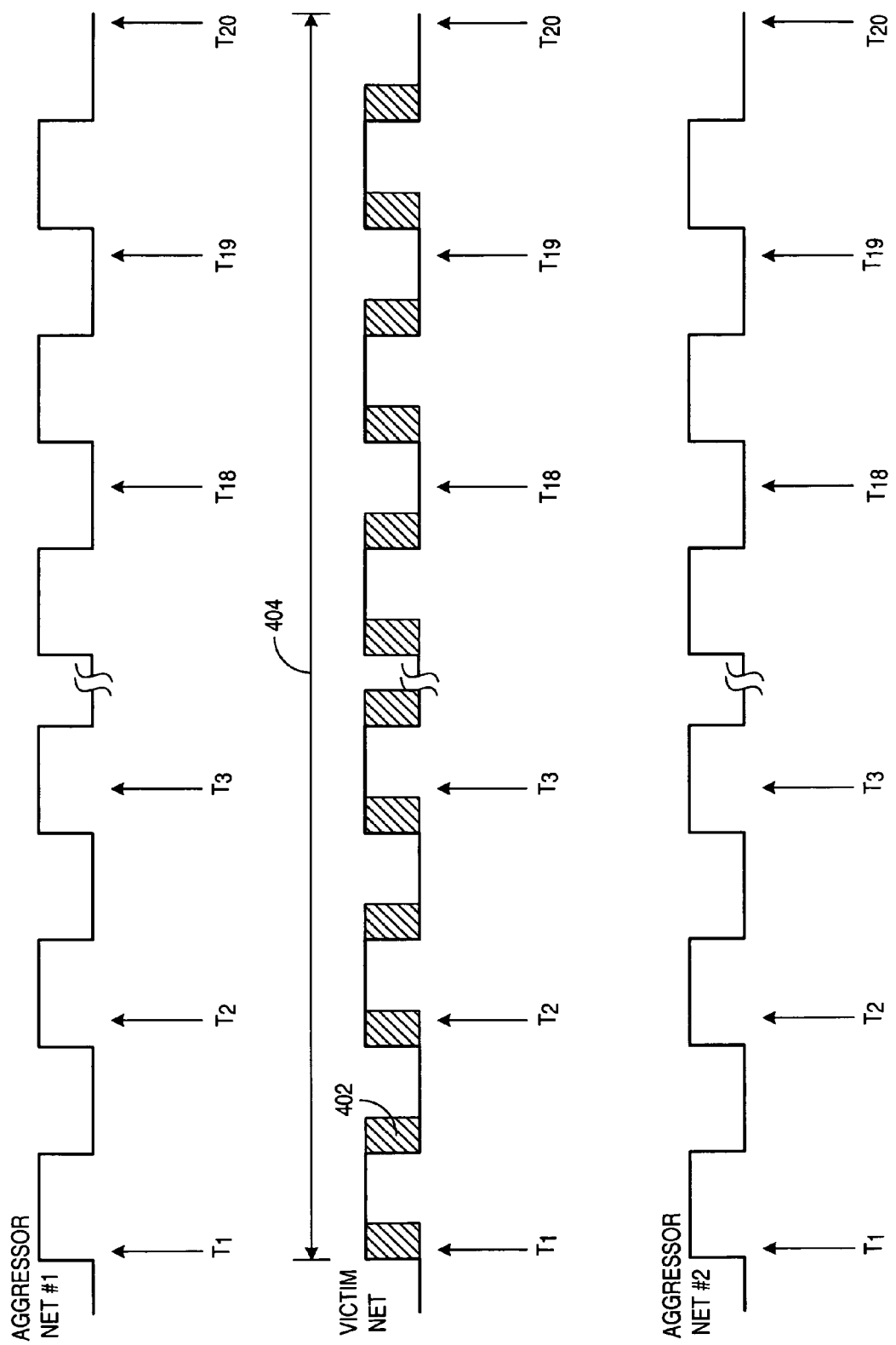
FIG. 4 illustrates an exemplary timing diagram as may be generated by the reconfigurable test circuit of FIG. 3.
Figure 5:
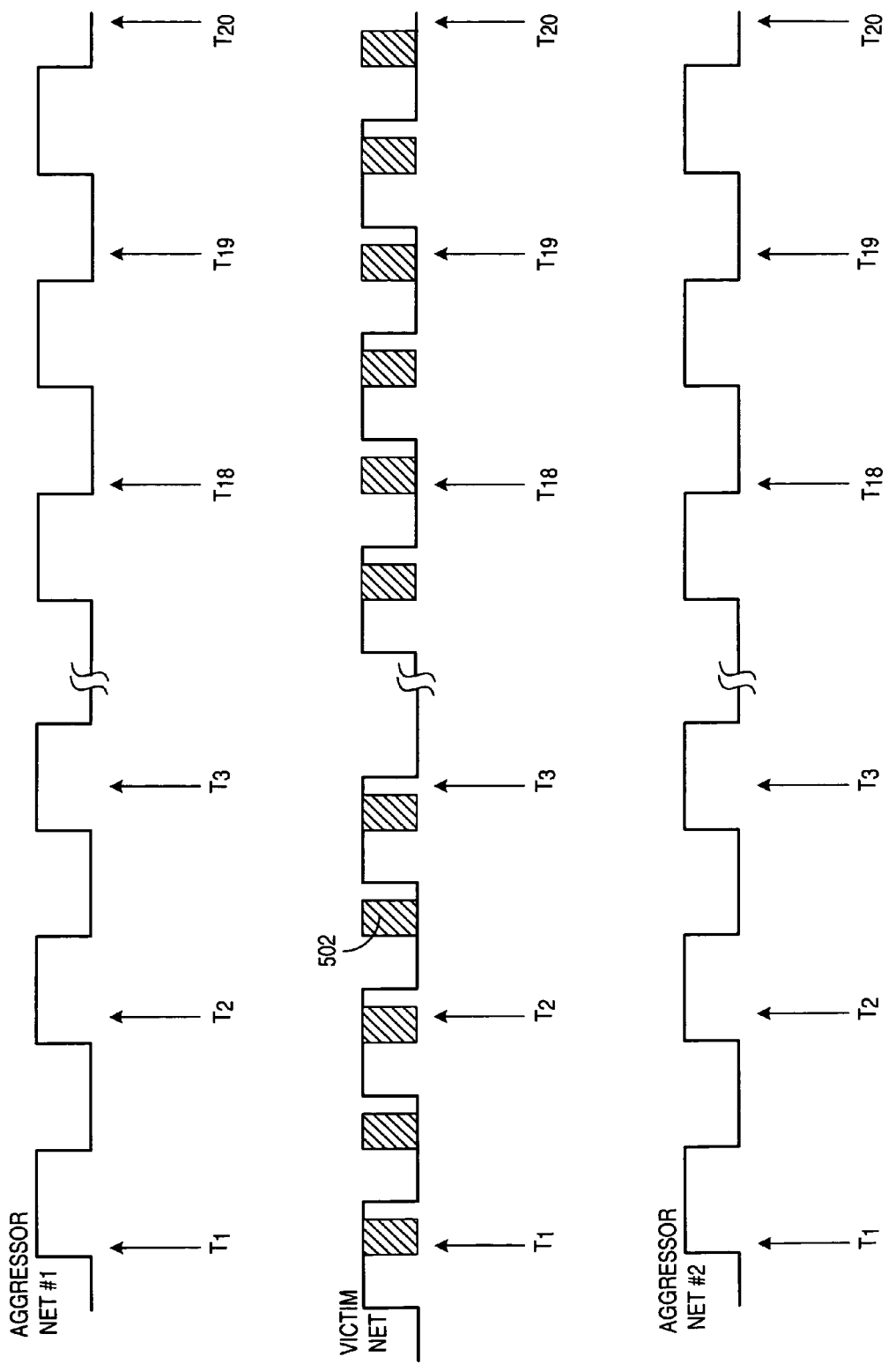
FIG. 5 illustrates an alternative timing diagram as may be generated by the reconfigurable test circuit of FIG. 3.

Turning to FIGS. 4-5, exemplary timing diagrams are illustrated, in which sampling instances T1-T20 denote, for example, progressively delayed sampling instances of the sampling clocks received by sampling circuits 304-308 from delay circuit 302. As can be seen, each sampling instance occurs at a different location relative to the phase of each test signal. As discussed above, only one sampling instance of the sampling clock occurs for each test signal cycle, when the period of the test signals and the sampling clocks are equivalent.

Sampling instance T1 occurs at a first cycle of each test signal. Sampling instance T2 occurs at a second cycle of each test signal, but sampling instance T2 is delayed relative to sampling instance T1 by one delay increment. Thus, sampling instance T2 occurs at a different phase with respect to each test signal as compared to sampling instance T1. Similarly, sampling instance T3 of the third cycle of each test signal is delayed from sampling instance T2 by the delay increment. Thus, sampling instance T3 occurs at a different phase with respect to each test signal as compared to sampling instances T1 and T2. As illustrated in FIG. 4, 20 cycles of each test signal transpire in order to capture 20 samples of each test signal at sampling instances T1-T20.

Sampling instances T1-T20 are separated in time by the period of the sampling clock plus the total delay implemented, where the total delay implemented is equivalent to the amount of delay being implemented by delay circuit 302. If, for example, the frequency of each test signal is 200 MHz, then one period of each test signal is equal to 5 nS. Given that sampling instances T1-T20 span a full period of each test signal, then each sampling instance is separated by 0.25 nS, which is to say that the delay increment implemented by delay circuit 302 is equal to 0.25 nS when 20 sampling instances are used to sweep a 360 degree cycle of each test signal.

It can be seen that the number of sampling instances may be increased to obtain a finer resolution. In particular, given that the delay element of an IOB is used to implement delay circuit 302, for example, then 64 delay increments may be possible. As such, sampling instances T1-T64, separated by 78.125 pS (5 nS/64), are used to sweep a 360 degree cycle of each test signal. Using the IOB, however, the delay increment values are controlled using a control clock at 200 MHz to obtain the 5 nS period. Alternatively, if the phase offset capability of a DCM is used to implement delay circuit 302, for example, then 256 delay increments may be possible. As such, sampling instances T1-T256, separated by 19.53 pS (5 nS/256), are used to sweep a 360 degree cycle of each test signal.

A first phase of a test period may be executed, whereby a test signal is first transmitted through the victim net, in the absence of active test signals in aggressor nets #1 and #2, to determine a baseline performance. A 50% duty cycle, for example, of the test signal transmitted through the victim net may be measured during time period 404 by analyzer 312 in the absence of test signals transmitted through aggressor nets #1 and #2. In other words, sampling instances T1-T10 may yield logic high valued samples of the test signal during the first half of test period 404, since cross-talk interference regions 402 are presumably non-existent in the absence of active aggressor nets. Similarly, sampling instances T11-T20 may yield logic low valued samples of the test signal during the second half of test period 404.

During a second phase of the test period, one or both of the aggressor nets may be energized with test signals that are in phase with the victim net as shown in FIG. 4. In such an instance, the capacitive coupling may affect the slew rate of each net, such that the rising and falling edges of the test signal in the victim net may occur within cross-talk interference ranges 402, thus potentially affecting duty cycle measurements taken by analyzer 312. For example, samples taken at sampling instances T1 and T2 by sampling circuit 306 may either be a logic high or a logic low, which may then be detected by analyzer 312 and appropriately analyzed to make a determination as to the cross-talk interference effects caused by the energized aggressor nets #1 and/or #2 on the energized victim net.

At each cycle of the second phase of the test period, the delay implemented by delay circuit 302 is progressively increased by a delay increment, e.g., 0.25 nS, provided that a 20 delay increment resolution is used over a 5 nS period. For example, the first sampling instance, T1, may be conducted with 0.25 ns delay, such that sampling instance T1 occurs at the beginning of the first cycle of each test signal as illustrated in FIG. 4. The second sampling instance, T2, may be conducted with a 0.5 nS delay, such that sampling instance, T2, occurs within the second cycle of each test signal at a phase that is delayed from sampling instance T1 by one period of the sampling clock plus 0.25 nS. Similarly, the third sampling instance, T3, may be conducted with a 0.75 nS delay, such that sampling instance, T3, occurs within the third cycle of each test signal at a phase that is delayed from sampling instance T1 by two periods of the sampling clock plus 0.5 nS. Once sampling instance T20 has transpired, 20 samples will have been taken at 20 different points relative to the cycle of each test signal.

It can be seen that sampling instances T1 and T2 of sampling circuit 306 may yield either a logic high valued sample or a logic low valued sample due to the logic uncertainty of regions 402 caused by crosstalk from aggressor nets #1 and/or #2. Thus, after the first 10 samples of the victim test signal during the first half of the second phase of the test period, a total of 9+/−1 logic high valued samples are likely to be measured for delay values between 0.25 and 2.5 nS.

In this instance, therefore, analyzer 312 may detect a difference between the baseline measurements taken for the victim net during the first half of the first phase of the test period and the test measurements taken during the first half of the second phase of the test sequence. A difference is detected, for example, if less than 10 logic high values of the test signal transmitted through the victim net are measured during the first half of the second phase of the test sequence. Differences may be similarly detected for delay values between 2.75 nS and 5 nS during the second half of the second phase of the victim signal test sequence.

It should be noted, that analyzer 312 may be configured as an on-chip resource, or conversely, may exist as a portion of test equipment external to the chip under test. Providing analyzer 312 as an on-chip resource, provides a test circuit that is totally encapsulated on-chip. Furthermore, processor 110 of FIG. 1 may be configured to execute test code that defines the built-in test (BIT) to be executed on-chip. In particular, processor 110 may execute test code, which provides the necessary control signals to exercise the victim net and one or more aggressor nets over a given test period for crosstalk distortion measurements. Once the test period expires, the results may be calculated and formatted for upload to an entity external to the chip.

Turning to FIG. 5, a 90/270 degree phase offset between the victim net and the aggressor nets #1 and #2 is illustrated. As discussed above, the victim net may be energized during a first phase of the test period, so as to characterize the behavior of the victim net in the absence of energized aggressor nets. One or both of the aggressor nets may then be energized with test signals that are 90 or 270 degrees out of phase with respect to the test signal transmitted through the victim net.

Capacitive coupling may affect the logic state of the victim net at instances 502 due to the logic transitions of aggressor nets #1 and/or #2. The detrimental effects being detected, for example, at sampling instances T1, T2, T18, and T19 by analyzer 312 and compared to the baseline results in order to make a determination as to the crosstalk effects imposed by aggressor nets #1 and #2.

It should be noted, that the test signal samples taken during the test periods depicted in FIGS. 4 and 5 may be further analyzed. In particular, analyzer 312 may reconstruct the sampled test signals into data that may be plotted and displayed graphically by test equipment external to the chip under test. In this way, test data generated internally to the chip under test, may be viewed and analyzed as if a test probe had been applied to the chip to obtain the same data.

Figure 6:
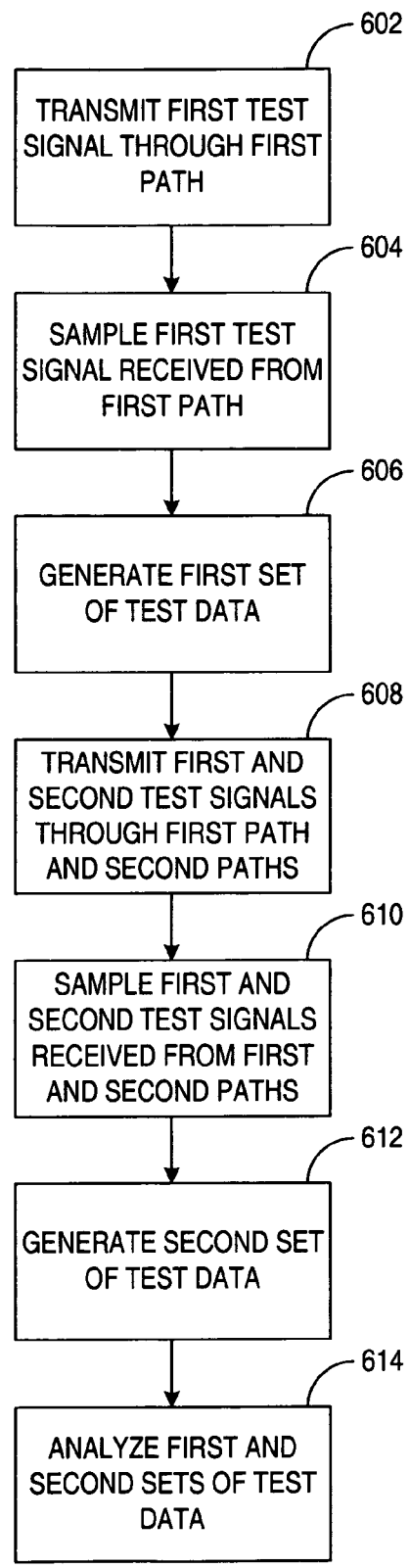
FIG. 6 illustrates an exemplary flow diagram in accordance with one embodiment of the present invention.

Turning to FIG. 6, an exemplary flow diagram in accordance with one embodiment of the present invention is illustrated. In step 602, a first test signal is transmitted through a test path within an IC, such as an FPGA. The first test signal is then sampled at progressively delayed sampling instances via, e.g., sampling circuit 306 of FIG. 3 as in step 604. A first set of test data is then generated from the sampled data as in step 606.

In step 608, the first test signal is re-transmitted in the presence of one or more other signals as illustrated, for example, in FIG. 3. The first test signal is transmitted, for example, via the victim net, while the one or more other signals are transmitted via the aggressor nets. At least the first test signal is then sampled by, e.g., sampling circuit 306, as in step 610, while the one or more other test signals are propagated through the aggressor nets and optionally sampled via, e.g., sampling circuits 304 and 308. Each sample taken during steps 604 and 610 are taken at progressively delayed sampling instances as discussed above in relation to FIGS. 4 and 5.

A second set of test data is then generated from at least the samples taken from sampling circuit 306 and optionally from the samples taken from sampling circuits 304 and 308. The second set of test data and the first set of test data is then analyzed in step 614 to determine whether any differences between the first and second sets of test data exist. A measure of signal distortion on the victim net that may have been caused by the aggressor nets may then be quantified.

In alternative embodiments, multiple test periods may be utilized in an effort to reduce the effects of non-deterministic effects. In particular, sampling clock jitter may alter the placement of the sampling instances within a particular test period, which may produce anomalous test results. By repeating the test periods, a collection of samples may be obtained for each sampling instance. The samples for each collection may then be averaged, or manipulated in some other fashion, so as to mitigate any non-deterministic effects.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of measuring signal distortion within an integrated circuit (IC), comprising:
    transmitting a first test signal through a first path within the IC absent other test signals in proximity to the first path;
    sampling the first test signal received from the first path at progressively delayed sampling instances with respect to the first test signal to generate a first set of test data;
    transmitting a second test signal through a second path within the IC in proximity to the first path while the first test signal is being transmitted; and
    sampling the first test signal received from the first path at progressively delayed sampling instances with respect to the first test signal while the second test signal is being transmitted to generate a second set of test data, wherein differences between the first and second sets of test data indicate a measure of signal distortion.

2. The method of claim 1, wherein transmitting the first test signal comprises transmitting the first test signal at a first duty cycle.

3. The method of claim 2, wherein sampling the first test signal comprises determining a period of the first test signal.

4. The method of claim 3, wherein sampling the first test signal further comprises dividing the period of the first test signal by a number of delay taps to determine a delay increment.

5. The method of claim 4, wherein sampling the first test signal further comprises progressively delaying the sampling instances by the determined delay increment.

6. The method of claim 2, wherein transmitting the second test signal comprises transmitting the second test signal at the first duty cycle in phase with the first test signal.

7. The method of claim 2, wherein transmitting the second test signal comprises transmitting the second test signal at the first duty cycle out of phase with the first test signal.

8. The method of claim 1, further comprising:
    transmitting a third test signal through a third path within the IC in proximity to the first and second paths while the first and second test signals are being transmitted; and
    sampling the first test signal received from the first path at progressively delayed sampling instances while the second and third test signals are being transmitted to generate a third set of test data, wherein differences between the first and third sets of test data indicate an alternative measure of signal distortion.

9. A signal distortion measurement circuit, comprising:
    a signal generator adapted to generate a first test signal during a first test period and adapted to generate first and second test signals during a second test period;
    a first test path coupled to receive the first test signal from the signal generator;
    a second test path in proximity to the first test path and coupled to receive the second test signal from the signal generator; and
    a measurement circuit coupled to the first and second test paths and adapted to sample the first test signal at progressively delayed sampling instances during the first and second test periods and further adapted to generate respective first and second sets of test data, wherein a level of signal distortion is indicated by differences between the first and second data sets.

10. The signal distortion measurement circuit of claim 9, wherein the measurement circuit comprises a clock source adapted to provide a sampling clock having the progressively delayed sampling instances.

11. The signal distortion measurement circuit of claim 10, wherein the measurement circuit further comprises:
    a first sampling circuit coupled to receive the first test signal and coupled to receive the sampling clock and adapted to provide the first test signal samples during the first and second test periods; and
    a second sampling circuit coupled to receive the second test signal and coupled to receive the sampling clock and adapted to provide the second test signal samples during the second test period.

12. A method of configuring a programmable logic device (PLD) to measure crosstalk distortion, the method comprising:
    defining a plurality of test paths within the PLD;
    configuring logic resources within the PLD to implement a test circuit coupled to the plurality of test paths; and
    activating the test circuit to perform a crosstalk measurement, wherein activating the test circuit includes,
        transmitting a first test signal through a first test path in the absence of other test signals;
        sampling the first test signal at the output of the first test path at progressively delayed sampling instances relative to the first test signal during a first test period;
        transmitting a second test signal through a second test path in the presence of the first test signal; and
        sampling the first test signal at the output of the first test path at progressively delayed sampling instances relative to the first test signal while transmitting the second test signal during a second test period, wherein the samples taken during the first and second test periods are compared to determine the measure of crosstalk distortion.

13. The method of claim 12, wherein configuring logic resources within the PLD to implement a test circuit comprises configuring a first clock source coupled to the plurality of test paths to generate the first and second test signals.

14. The method of claim 13, wherein configuring logic resources within the PLD to implement a test circuit further comprises configuring a second clock source to generate a sampling clock used to sample the first test signal at the progressively delayed sampling instances.

15. The method of claim 14, wherein configuring the second clock source to generate the sampling clock comprises configuring a plurality of delay taps within the second clock source to receive a reference clock and to generate the sampling clock at an output of each delay tap, wherein the sampling clock at each delay tap output exhibits a fixed amount of delay with respect to the reference clock.

16. The method of claim 15, wherein configuring logic resources within the PLD to implement a test circuit further comprises configuring a sampling circuit coupled to the first test path and the second clock source.

17. The method of claim 16, wherein activating the test circuit further includes progressively selecting a different delay tap output to generate the sampling clock.

18. The method of claim 17, wherein activating the test circuit further includes:
  receiving the sampling clock from each delay tap output at the sampling circuit; and
  sampling a logic level of the first test signal at the sampling circuit using each sampling clock received from each delay tap output.

19. The method of claim 18, wherein activating the test circuit further includes:
  accumulating the samples taken at the sampling circuit using an analyzer configured within the PLD; and
  analyzing the accumulated samples using a processor configured within the PLD to determine the measure of crosstalk distortion.

20. The method of claim 18, wherein activating the test circuit further includes:
  accumulating the samples taken at the sampling circuit using an analyzer configured external to the PLD; and
  analyzing the accumulated samples using a processor configured external to the PLD to determine the measure of crosstalk distortion.

* * * * *